(12) United States Patent
Brew et al.

(10) Patent No.: US 10,164,179 B2
(45) Date of Patent: Dec. 25, 2018

(54) MEMRISTIVE DEVICE BASED ON ALKALI-DOPING OF TRANSITIONAL METAL OXIDES

(71) Applicant: INTERNATIONAL BUSINESS MACHINES CORPORATION, Armonk, NY (US)

(72) Inventors: Kevin W. Brew, White Plains, NY (US); Talia S. Gershon, White Plains, NY (US); Dennis M. Newns, Yorktown Heights, NY (US); Saurabh Singh, Queens, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/405,555

(22) Filed: Jan. 13, 2017

(65) Prior Publication Data

US 2018/0205011 A1    Jul. 19, 2018

(51) Int. Cl.
*H01L 47/00* (2006.01)
*H01L 45/00* (2006.01)

(52) U.S. Cl.
CPC ........ *H01L 45/085* (2013.01); *H01L 45/1233* (2013.01); *H01L 45/1246* (2013.01); *H01L 45/1266* (2013.01); *H01L 45/146* (2013.01); *H01L 45/1608* (2013.01)

(58) Field of Classification Search
CPC ..... H01L 45/14; H01L 45/145; H01L 45/146; H01L 45/147; H01L 45/1641; H01L 45/1233; H01L 45/1246; H01L 45/1266; H01L 45/1608; H01L 45/06; H01L 45/08; H01L 45/055

USPC .................................. 257/1, 4; 438/382–385
See application file for complete search history.

(56) References Cited

U.S. PATENT DOCUMENTS

| 5,908,715 | A   | * | 6/1999  | Liu       | H01M 4/133 |
|           |     |   |         |           | 429/217    |
| 8,120,071 | B2  |   | 2/2012  | Bratkovski et al. |    |
| 9,240,550 | B2  |   | 1/2016  | Dellmann et al. |    |
| 9,331,274 | B2  |   | 5/2016  | Moradpour et al. |    |
| 2010/0119946 | A1 | * | 5/2010 | Kim       | H01M 4/364 |
|           |     |   |         |           | 429/231.95 |

(Continued)

FOREIGN PATENT DOCUMENTS

CN    101315969 A    12/2008
CN    102244193 A    11/2011

(Continued)

OTHER PUBLICATIONS

Greenlee, et al., "Spatiotemporal drift-diffusion simulations of analog ionic memristors," Journal of Applied Physics, Published online Jul. 19, 2013; pp. 1-10.

(Continued)

*Primary Examiner* — Brook Kebede
(74) *Attorney, Agent, or Firm* — Cantor Colburn LLP; Vazken Alexanian

(57) ABSTRACT

Embodiments are directed to a memristive device. The memristive device includes a first conductive material layer. An oxide material layer is arranged on the first conductive layer. And a second conductive material layer is arranged on the oxide material layer, wherein the second conductive material layer comprises a metal-alkali alloy.

15 Claims, 14 Drawing Sheets

(56) References Cited

U.S. PATENT DOCUMENTS

| | | | |
|---|---|---|---|
| 2011/0169052 A1 | 7/2011 | Bratkovski et al. | |
| 2012/0049147 A1* | 3/2012 | Hong | H01L 45/08 257/4 |
| 2012/0113706 A1 | 5/2012 | Williams et al. | |
| 2013/0277638 A1* | 10/2013 | Moradpour | H01L 45/04 257/4 |
| 2014/0103281 A1 | 4/2014 | Lin et al. | |
| 2014/0184380 A1* | 7/2014 | Aggarwal | H01C 10/10 338/13 |
| 2015/0053908 A1* | 2/2015 | Fowler | H01L 45/04 257/4 |
| 2016/0071565 A1* | 3/2016 | Lemke | H01L 27/10805 365/226 |

FOREIGN PATENT DOCUMENTS

| | | | | |
|---|---|---|---|---|
| CN | 104752608 A | 7/2015 | | |
| CN | 104916777 | 9/2015 | | |
| JP | 04033259 A | * 2/1992 | | H01M 4/58 |
| WO | 2011133158 A1 | 10/2011 | | |
| WO | 2010082928 A1 | 10/2013 | | |

OTHER PUBLICATIONS

Mai, et al., "Memristive and neuromorphic behavior in a LixCoO2 nanobattery", Scientific Reports, Published Jan. 14, 2015, pp. 1-6.
Shi, et al., "Colossal resistance switching and band gap modulation in a perovskite nickelate by electron doping", Nature Communications, Published Sep. 3, 2014, pp. 1-9.
International Search Report & Written Opinion for PCT/IB2018050033 dated May 4, 2018; 10 pages.

* cited by examiner f(x) = f (INPUT 1 * CONNECTION STRENGTH 1 + INPUT 2 * CONNECTION STRENGTH 2)

$i = g(s,v)$  EQUATION [1]

$\dfrac{\partial s(t)}{\partial t} = f(i,s,t)$  EQUATION [2]

MEMRISTIVE DEVICE BASED ON ALKALI-DOPING OF TRANSITIONAL METAL OXIDES

BACKGROUND

The present invention relates to memristive devices. More specifically, the present invention relates to a memristive device based on alkali-doping of transitional metal oxides.

"Machine learning" is used to broadly describe a primary function of electronic systems that learn from data. In accelerated machine learning and cognitive science, artificial neural networks (ANNs) are a family of statistical learning models inspired by the biological neural networks of animals, and in particular the brain. ANNs can be used to estimate or approximate systems and functions that depend on a large number of inputs and are generally unknown. ANN architectures, neuromorphic microchips and ultra-high density nonvolatile memory can be formed from high density, low cost circuit architectures known as cross-bar arrays. A basic crossbar array configuration includes a set of conductive row wires and a set of conductive column wires formed to intersect the set of conductive row wires. The intersections between the two sets of wires are separated by so-called crosspoint devices, which can be formed from thin film material. Cross-point devices can be implemented as so-called memristive devices. Characteristics of a memristive device include non-volatility, the ability to store a variable resistance value, and the ability to tune up or tune down a resistance using current or voltage pulses.

SUMMARY

According to an embodiment of the present invention, a memristive device includes a first conductive material layer. An oxide material layer is arranged on the first conductive layer. And a second conductive material layer is arranged on the oxide material layer, wherein the second conductive material layer comprises a metal-alkali alloy.

According to another embodiment of the present invention, a method of forming a memristive device includes depositing an oxide material layer on a portion of a first conductive material layer. A second conductive material layer is deposited on a portion of the layer of oxide material, wherein the second conductive material layer comprises a metal-alkali alloy.

According to another embodiment of the present invention, a memristive device includes a first conductive material layer. An oxide material layer is arranged on the first conductive material layer. A diffusion barrier layer is arranged on the oxide material layer. A second conductive material layer is arranged on the oxide material layer, wherein the second conductive material layer comprises a metal-alkali alloy.

According to another embodiment of the present invention, a method of forming a memristive device includes depositing an oxide material layer on a portion of a first conductive material layer. A diffusion barrier layer is deposited on a portion of the oxide material layer. A second conductive material layer is deposited on a portion of the layer of oxide material, wherein the second conductive material layer includes a metal-alkali alloy.

According to another embodiment of the present invention, a memristive device includes a first conductive material layer. An oxide material layer is arranged on the first conductive material layer, wherein the oxide material layer is exposed to an alkali metal for a duration of time. A second conductive material layer is arranged on the oxide material layer.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

DETAILED DESCRIPTION

Figure 1:
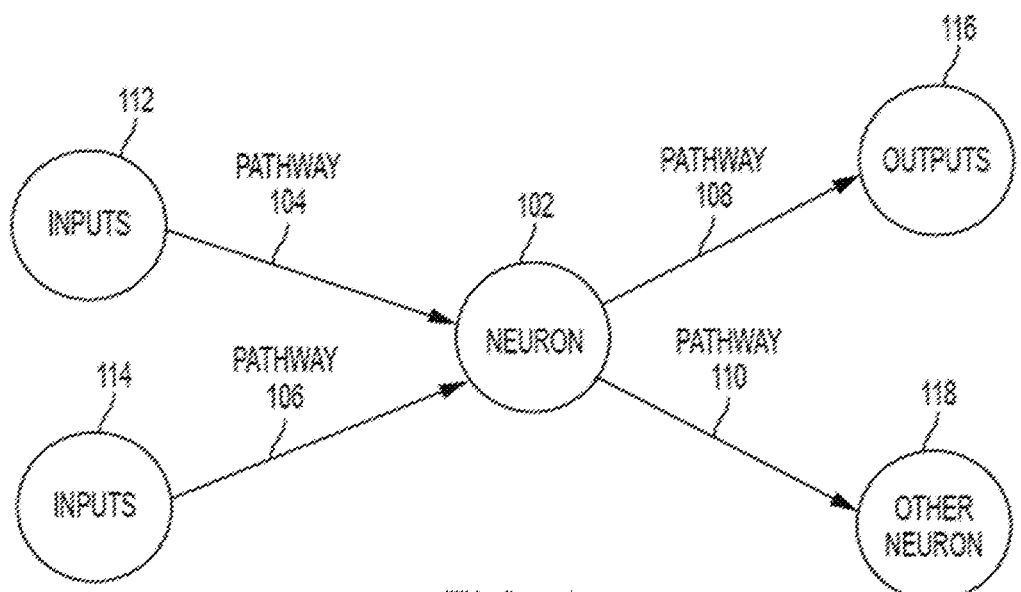
FIG. 1 depicts a simplified diagram of input and output connections of a biological neuron.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched and the second element can act as an etch stop. The term "about" is intended to include the degree of error associated with measurement of the particular quantity based upon the equipment available at the time of filing the application. For example, "about" can include a range of ±8% or 5%, or 2% of a given value.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE) and more recently, and atomic layer deposition (ALD) among others.

Removal/etching is any process that removes material from the wafer. Examples include etch processes (either wet or dry), and chemical-mechanical planarization (CMP), and the like. A wet etch process, such as a buffered hydrofluoric acid (BHF) etch, is a material removal process that uses liquid chemicals or etchants to remove materials from a surface. A dry etch process, such as reactive ion etching (ME), uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies relevant to the present invention, as previously noted herein, anamorphic neural networks (ANNs) are often embodied as so-called "neuromorphic" systems of interconnected processor elements that act as simulated "neurons" and exchange "messages" between each other in the form of electronic signals. Similar to the so-called "plasticity" of synaptic neurotransmitter connections that carry messages between biological neurons, the connections in ANNs that carry electronic messages between simulated neurons are provided with numeric weights that correspond to the strength or weakness of a given connection. The weights can be adjusted and tuned based on experience, making ANNs adaptive to inputs and capable of learning. For example, an ANN for handwriting recognition is defined by a set of input neurons which can be activated by the pixels of an input image. After being weighted and transformed by a function determined by the network's designer, the activations of these input neurons are then passed to other downstream neurons, which are often referred to as "hidden" neurons. This process is repeated until an output neuron is activated. The activated output neuron determines which character was read.

Crossbar arrays, also known as crosspoint arrays or crosswire arrays, are high density, low cost circuit architectures used to form a variety of electronic circuits and devices, including ANN architectures, neuromorphic microchips and ultra-high density nonvolatile memory. A basic crossbar array configuration includes a set of conductive row wires and a set of conductive column wires formed to intersect the set of conductive row wires. The intersections between the two sets of wires are separated by so-called crosspoint devices, which can be formed from thin film material.

Crosspoint devices, in effect, function as the ANN's weighted connections between neurons. Nanoscale two-terminal devices, for example memristors having "ideal" conduction state switching characteristics, are often used as the crosspoint devices in order to emulate synaptic plasticity with high energy efficiency. The conduction state (e.g., resistance) of the ideal memristor material can be altered by controlling the voltages applied between individual wires of the row and column wires. Digital data can be stored by alteration of the memristor material's conduction state at the intersection to achieve a high conduction state or a low conduction state. The memristor material can also be programmed to maintain two or more distinct conduction states by selectively setting the conduction state of the material. The conduction state of the memristor material can be read by applying a voltage across the material and measuring the current that passes through the target crosspoint device.

In order to limit power consumption, the crosspoint devices of ANN chip architectures are often designed to utilize offline learning techniques, wherein the approximation of the target function does not change once the initial training phase has been resolved. Offline learning allows the crosspoint devices of crossbar-type ANN architectures to be simplified such that they draw very little power.

Notwithstanding the potential for lower power consumption, executing offline training can be difficult and resource intensive because it is typically necessary during training to modify a significant number of adjustable parameters (e.g., weights) in the ANN model to match the input-output pairs for the training data. Accordingly, simplifying the crosspoint devices of ANN architectures to prioritize power-saving, offline learning techniques typically means that training speed and training efficiency are not optimized.

Although embodiments of the present invention are directed to electronic systems, for ease of reference and explanation various aspects of the electronic systems are described using neurological terminology such as neurons, plasticity and synapses, for example. It will be understood that for any discussion or illustration herein of an electronic system, the use of neurological terminology or neurological shorthand notations are for ease of reference and are meant to cover the neuromorphic, ANN equivalent(s) of the described neurological function or neurological component.

ANNs incorporate knowledge from a variety of disciplines, including neurophysiology, cognitive science/psychology, physics (statistical mechanics), control theory, computer science, artificial intelligence, statistics/mathematics, pattern recognition, computer vision, parallel processing and hardware (e.g., digital/analog/VLSI/optical). Instead of utilizing the traditional digital model of manipulating zeros and ones, ANNs create connections between processing elements that are substantially the functional equivalent of the core system functionality that is being estimated or approximated. For example, IBM™'s SyNapse™ computer chip is the central component of an electronic neuromorphic machine that attempts to provide similar form, function and architecture to the mammalian brain. Although the IBM SyNapse computer chip uses the same basic transistor components as conventional computer chips, its transistors are configured to mimic the behavior of neurons and their synapse connections. The IBM SyNapse computer chip processes information using a network of just over one million simulated "neurons," which communicate with one another using electrical spikes similar to the synaptic communications between biological neurons. The IBM SyNapse architecture includes a configuration of processors (i.e., simulated "neurons") that read a memory (i.e., a simulated "synapse") and perform simple operations. The communications between these processors, which are typically located in different cores, are performed by on-chip network routers.

Figure 2:
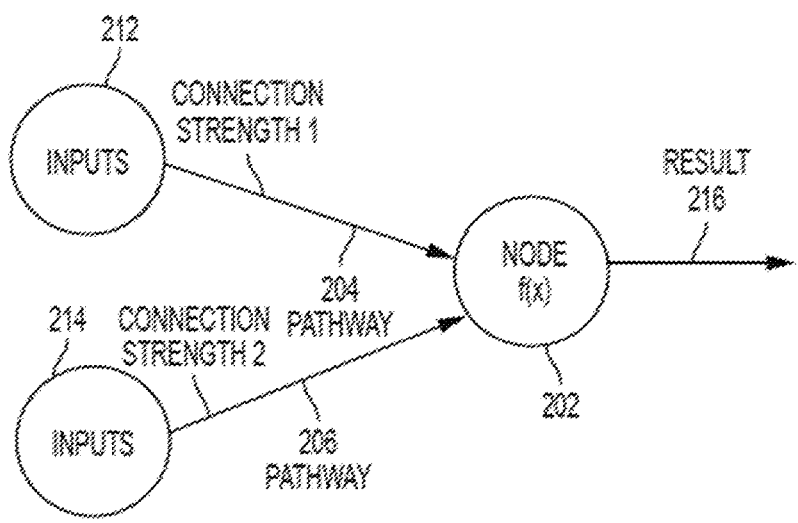
FIG. 2 depicts a known simplified model of the biological neuron shown in FIG. 1.
Figure 3:
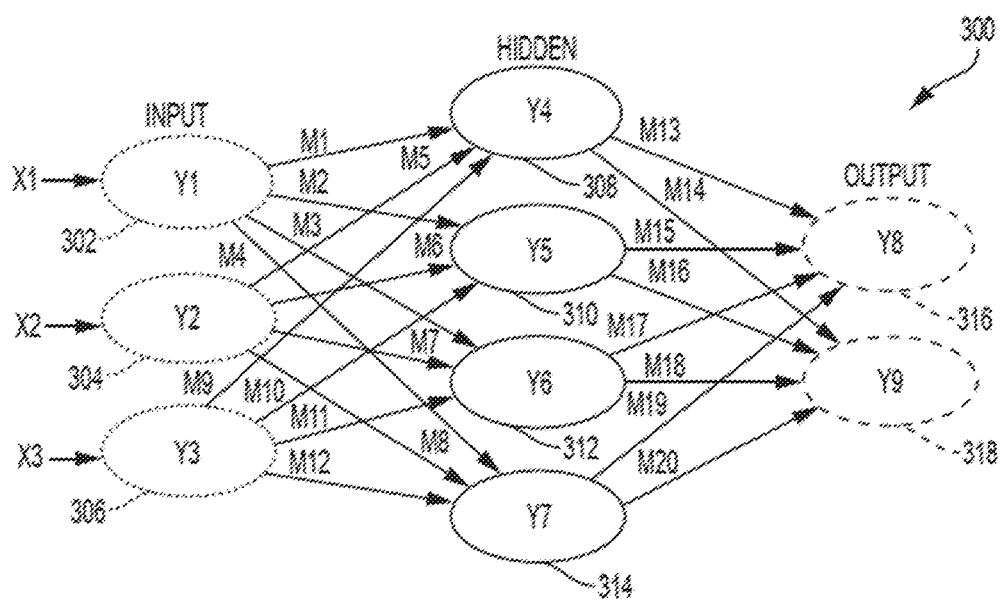
FIG. 3 depicts a known simplified model of an ANN incorporating the biological neuron model shown in FIG. 2.

A general description of how a typical ANN operates will now be provided with reference to FIGS. 1, 2 and 3. As previously noted herein, a typical ANN models the human brain, which includes about one hundred billion interconnected cells called neurons. FIG. 1 depicts a simplified diagram of a biological neuron 102 having pathways 104, 106, 108, 110 that connect it to upstream inputs 112, 114, downstream output s116 and downstream "other" neurons 118, configured and arranged as shown. Each biological neuron 102 sends and receives electrical impulses through pathways 104, 106, 108, 110. The nature of these electrical impulses and how they are processed in biological neuron 102 are primarily responsible for overall brain functionality. The pathway connections between biological neurons can be strong or weak. When a given neuron receives input impulses, the neuron processes the input according to the neuron's function and sends the result of the function to downstream outputs and/or downstream "other" neurons.

Biological neuron 102 is modeled in FIG. 2 as a node 202 having a mathematical function, f(x) depicted by the equation shown in FIG. 2. Node 202 takes electrical signals from inputs 212, 214, multiplies each input 212, 214 by the strength of its respective connection pathway 204, 206, takes a sum of the inputs, passes the sum through a function, f(x), and generates a result 216, which can be a final output or an input to another node, or both. In the present description, an asterisk (*) is used to represent a multiplication. Weak input signals are multiplied by a very small connection strength number, so the impact of a weak input signal on the function is very low. Similarly, strong input signals are multiplied by a higher connection strength number, so the impact of a strong input signal on the function is larger. The function f(x) is a design choice, and a variety of functions can be used. A typical design choice for f(x) is the hyperbolic tangent function, which takes the function of the previous sum and outputs a number between minus one and plus one.

FIG. 3 depicts a simplified ANN model 300 organized as a weighted directional graph, wherein the artificial neurons are nodes (e.g., 302, 308, 316), and wherein weighted directed edges (e.g., m1 to m20) connect the nodes. ANN model 300 is organized such that nodes 302, 304, 306 are input layer nodes, nodes 308, 310, 312, 314 are hidden layer nodes and nodes 316, 318 are output layer nodes. Each node is connected to every node in the adjacent layer by connection pathways, which are depicted in FIG. 3 as directional arrows having connection strengths m1 to m20. Although only one input layer, one hidden layer and one output layer are shown, in practice, multiple input layers, hidden layers and output layers can be provided.

Similar to the functionality of a human brain, each input layer node 302, 304, 306 of ANN 300 receives inputs x1, x2, x3 directly from a source (not shown) with no connection strength adjustments and no node summations. Accordingly, y1=f(x1), y2=f(x2) and y3=f(x3), as shown by the equations listed at the bottom of FIG. 3. Each hidden layer node 308, 310, 312, 314 receives its inputs from all input layer nodes 302, 304, 306 according to the connection strengths associated with the relevant connection pathways. Thus, in hidden layer node 308, y4=f(m1*y1+m5*y2+m9*y3), wherein * represents a multiplication. A similar connection strength multiplication and node summation is performed for hidden layer nodes 310, 312, 314 and output layer nodes 316, 318, as shown by the equations defining functions y5 to y9 depicted at the bottom of FIG. 3.

ANN model 300 processes data records one at a time, and it "learns" by comparing an initially arbitrary classification of the record with the known actual classification of the record. Using a training methodology knows as "backpropagation" (i.e., "backward propagation of errors"), the errors from the initial classification of the first record are fed back into the network and used to modify the network's weighted connections the second time around, and this feedback process continues for many iterations. In the training phase of an ANN, the correct classification for each record is known, and the output nodes can therefore be assigned "correct" values. For example, a node value of "1" (or 0.9) for the node corresponding to the correct class, and a node value of "0" (or 0.1) for the others. It is thus possible to compare the network's calculated values for the output nodes to these "correct" values, and to calculate an error term for each node (i.e., the "delta" rule). These error terms are then used to adjust the weights in the hidden layers so that in the next iteration the output values will be closer to the "correct" values.

There are many types of neural networks, but the two broadest categories are feed-forward and feedback/recurrent networks. ANN model 300 is a non-recurrent feed-forward network having inputs, outputs and hidden layers. The signals can only travel in one direction. Input data is passed onto a layer of processing elements that perform calculations. Each processing element makes its computation based upon a weighted sum of its inputs. The new calculated values then become the new input values that feed the next layer. This process continues until it has gone through all the layers and determined the output. A threshold transfer function is sometimes used to quantify the output of a neuron in the output layer.

A feedback/recurrent network includes feedback paths, which mean that the signals can travel in both directions using loops. All possible connections between nodes are allowed. Because loops are present in this type of network, under certain operations, it can become a non-linear dynamical system that changes continuously until it reaches a state of equilibrium. Feedback networks are often used in associative memories and optimization problems, wherein the network looks for the best arrangement of interconnected factors.

The speed and efficiency of machine learning in feed-forward and recurrent ANN architectures depend on how effectively the crosspoint devices of the ANN crossbar array perform the core operations of typical machine learning algorithms. Although a precise definition of machine learning is difficult to formulate, a learning process in the ANN context can be viewed as the problem of updating the crosspoint device connection weights so that a network can efficiently perform a specific task. The crosspoint devices typically learn the necessary connection weights from available training patterns. Performance is improved over time by iteratively updating the weights in the network. Instead of following a set of rules specified by human experts, ANNs "learn" underlying rules (like input-output relationships) from the given collection of representative examples. Accordingly, a learning algorithm can be generally defined as the procedure by which learning rules are used to update and/or adjust the relevant weights.

The three main learning algorithm paradigms are supervised, unsupervised and hybrid. In supervised learning, or learning with a "teacher," the network is provided with a correct answer (output) for every input pattern. Weights are determined to allow the network to produce answers as close as possible to the known correct answers. Reinforcement learning is a variant of supervised learning in which the network is provided with only a critique on the correctness of network outputs, not the correct answers themselves. In contrast, unsupervised learning, or learning without a teacher, does not require a correct answer associated with each input pattern in the training data set. It explores the underlying structure in the data, or correlations between patterns in the data, and organizes patterns into categories from these correlations. Hybrid learning combines supervised and unsupervised learning. Parts of the weights are usually determined through supervised learning, while the others are obtained through unsupervised learning. Additional details of ANNs and learning rules are described in Artificial Neural Networks: A Tutorial, by Anil K. Jain, Jianchang Mao and K. M. Mohiuddin, IEEE, March 1996, the entire description of which is incorporated by reference herein.

As previously noted herein, in order to limit power consumption, the crosspoint devices of ANN chip architectures are often designed to utilize offline learning techniques, wherein the approximation of the target function does not change once the initial training phase has been resolved. Offline learning allows the crosspoint devices of crossbar-type ANN architectures to be simplified such that they draw very little power.

Figure 4:
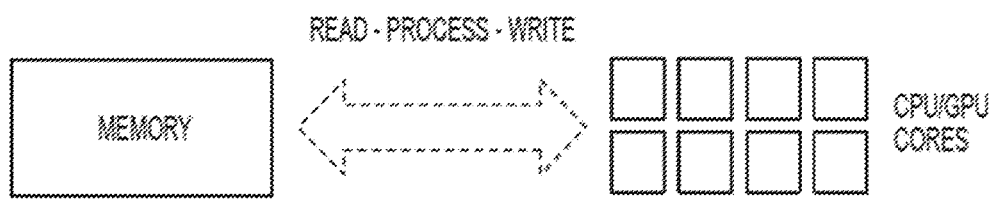
FIG. 4 depicts a simplified block diagram of a known weight update methodology.

Notwithstanding the potential for lower power consumption, executing offline training can be difficult and resource intensive because it is typically necessary during training to modify a significant number of adjustable parameters (e.g., weights) in the ANN model to match the input-output pairs for the training data. FIG. 4 depicts a simplified illustration of a typical read-process-write weight update operation, wherein CPU/GPU cores (i.e., simulated "neurons") read a memory (i.e., a simulated "synapse") and perform weight update processing operations, then write the updated weights back to memory. Accordingly, simplifying the crosspoint devices of ANN architectures to prioritize power-saving, offline learning techniques typically means that training speed and training efficiency are not optimized.

Providing simple crosspoint devices that keep power consumption within an acceptable range, as well as accelerate the speed and efficiency of training ANN architectures, would improve overall ANN performance and allow a broader range of ANN applications.

An overview of systolic arrays, stochastic computing and linear and non-linear memristor devices, which are relevant to embodiments of the present invention, will now be provided. Systolic arrays are composed of parallel processing elements (PE) that attempt to accelerate the learning of certain highly used algorithms. Systolic arrays are often hard-wired for specific operations, such as "multiply and accumulate," to perform massively parallel integration, convolution, correlation, matrix multiplication or data sorting tasks. In a publication by C. Lehmann et al., titled "A Generic Systolic Array Building Block For Neural Networks with On-Chip Learning," IEEE Transactions On Neural Networks, Vol. 4, No. 3, May 1993, it is proposed to use systolic arrays as a building block for online learning neural networks, wherein each PE in the systolic array has local storage to store a single weight value and is capable of performing computations necessary for matrix multiplication and weight updates. The very-large-scale integration (VLSI) implementation of the PE described in the Lehmann article requires approximately 1800 transistors per PE, which increases power consumption and decreases scalability. It is therefore desirable to provide PEs that requires as few transistors per PE as possible.

Figures 5, 6:
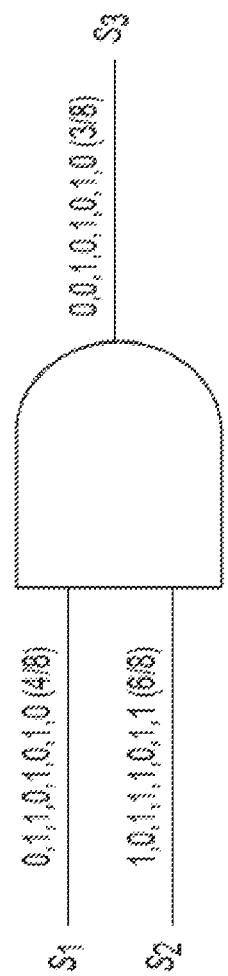
FIG. 5 depicts a simplified block diagram of a stochastic computing methodology capable of being used in one or more embodiments.
FIG. 6 depicts known equations that govern the operation of a passive, two-terminal memristor.

Stochastic computing is a collection of techniques that represent continuous values by streams of random bits, wherein complex computations can be computed by simple bit-wise operations on the streams. Specifically, if there are two random and independent bit streams $S_1$, $S_2$ called stochastic numbers (i.e., a Bernoulli process), wherein the probability of a "one" in the first stream is p, and the probability of a "one" in the second stream is q, the logical AND of the two streams can be taken as shown in FIG. 6. The probability of a "one" in the output stream is pq. By observing enough output bits and measuring the frequency of "ones," it is possible to estimate pq to arbitrary accuracy. Because of the design simplicity of these so-called "multiply and accumulate" operations, which can be implemented with a few logic gates/transistors, stochastic computing is often used in the hardware design for neural networks. A publication by V. K. Chippa et al. titled "StoRM: A Stochastic Recognition and Mining Processor," Proceedings of the 2014 International Symposium On Low power Electronics and Design, shows an application of stochastic computing to two-dimensional (2D) systolic arrays that can be used as a hardware accelerator for neural network training algorithms.

However, in the Chippa et al. article, the necessary weights for the computations are supplied to the systolic array from external locations, and updates to the weights are not performed by the array. The Chippa et al. article only addresses the acceleration of vector-matrix multiplication or matrix-matrix multiplication operations that are heavily used during neural network training. However, systolic arrays without local storage cannot perform the weight updates in parallel because the weights are stored at an external memory location. Accelerating the weight updates, which is not described by the Chippa et al. article, is necessary in order to accelerate the overall learning algorithm.

The term "memristor" is used to describe a passive two-terminal electrical component, wherein the resistance value of the device depends on the history of the voltages that have previously been applied to the device. The operation of a memristor is governed by Equations [1] and [2] shown in FIG. 6, wherein i is the current passing through the device, v is the voltage applied to the device, g is the conductance value of the device (which is the inverse of the resistance), s is the internal state variable of the device that controls the conductance value and $f$ is the function that shows the time evolution of the internal state variable s. In a publication by Chua, L. O., titled "Resistance Switching Memories are Memristors," Applied Physics A (2011), 102 (4): 765-783, memristor functionality is proposed for the operation of resistive memory devices such as resistive random-access-memory (RRAM), phase change memory (PCM) and conductive-bridging random-access-memory (CBRAM). Because a memristor device remembers its history (i.e., the so-called "non-volatility property"), the Chua article proposes such devices as possible alternatives for non-volatile memory technologies.

A publication by D. Soudry et al., titled "Memristor-Based Multilayer Neural Networks With Online Gradient Descent Training," IEEE Transactions On Neural Networks and Learning Systems (2015), proposes the use of memristors for back-propagating neural network training hardware. However, the Soudry et al article assumes an ideal memristor operation, wherein the change in resistance is linear with respect to the voltage applied to the device. The Soudry et al. design assumed that the function $f(s,v)$ in Equation [2] of FIG. 6 is a simple function given by the relationship $f(s,v)=v$. The Soudry et al. article proposes an architecture that is similar to a 2D systolic array as described above, wherein each crosspoint is implemented with an ideal memristor and a pair of transistors. In the Soudry et al. article, the memristor is in effect used to store the weight value, and the pair of transistors is used to compute a local multiplication operation that is needed for the weight updates, wherein the result of the weight update modifies the memristor's conduction state. The Soudry et al. article describes, in effect, a four terminal device composed of a memristor and two transistors, which are used to make a 2D array of the 4 terminal devices in order to implement the back-propagation training of the neural network hardware.

Figure 7:
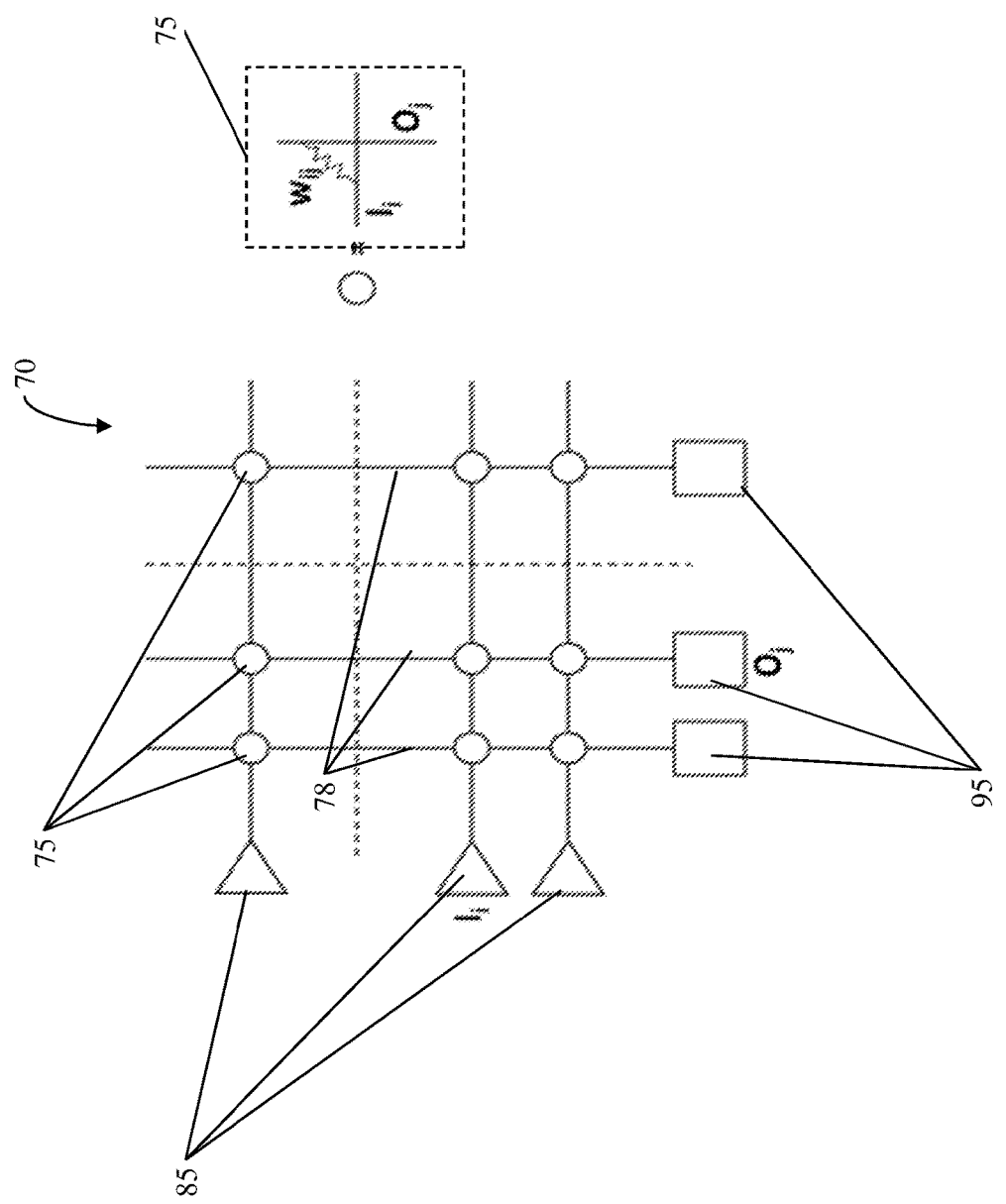
FIG. 7 depicts a single matrix of synapses with peripheral neurons according to one or more embodiments.

FIG. 7 illustrates a single matrix of "synapses" with peripheral "neurons" and with inputs and outputs according to one or more embodiments. The single matrix includes a set of synapses 75, a set of inputs 85, and a set of outputs 95. The illustrated embodiment is termed a "perceptron" 70. An objective of the perceptron 70 is to recognize an entity (or entities) such as a cat from a set of inputs 85, such as the pixels in a picture. Training involves getting the system to recognize the cat from a series of given inputs, so that it can recognize the cat from subsequent unknown inputs. In this example, the entity or entities is a cat; however, any type or number of entities can be used.

Given the synaptic weights which are conductances $w_{ji}$, the outputs $O_j$ are obtained by putting voltages $I_i$ on the inputs 85, and summing the currents at the outputs 95 to get $$\sum_i w_{ji} I_i,$$

then putting this result through a saturating amplifyer with characteristic op=g(ip) to get:

$$O_j = g\left(\sum_i w_{ji} I_i\right).$$

Here g(x); tan h(x). The synaptic weights $w_{ij}$ have to be obtained by training. The training is done by minimizing a cost function:

$$E(w) = \frac{1}{2} \sum_j \left[\zeta_j - g\left(\sum_i w_{ji} I_i\right)\right]^2,$$

where $\zeta_j$ is the desired output (e.g., cat), with respect to the $w_{ji}$. The result is the Hebbian update rule:

$$\Delta w_{ji} = \eta I_i \delta_j, \text{ where}$$

$$\delta_j = (\zeta_j - O_j) g'\left(\sum_i w_{ji} I_i\right).$$

Here η is a "learning rate". The saturating amplifyer plays a role when multiple arrays are connected in series (deep neural net). If the system remained linear (g(x)=x) then the extra arrays would concatenate into one array.

Current systems implement this scheme in software. However, the training is extremely slow (48 hours in a datacenter). Using a hardware implementation of the array (synapses 75 and neurons), the array can achieve a speed improvement because the training processes can be done in O(1) time. If the input voltages are applied simultaneously, then the currents in all the vertical wires 78 start immediately (modulo a capacitative charging time) and the results can be processed simultaneously in the output neurons. The result is the set of outputs $\delta_j$ computed by the output neurons.

To accomplish the Hebbian update rule $\Delta w_{ji} = \eta I_i \delta_j$, at each synapse 75, the product $I_i \delta_j$ is computed. This can be done in one implementation by using the concept of stochastic numbers.

For example, suppose that there are two random, independent bit streams called stochastic numbers. The bit streams can be assumed to be clocked pulse trains where the pulse amplitude is 1 or 0. Let the probability of a one in the first stream be p, and the probability in the second stream be q. We can take the product pq of the two streams as the probability of the logical AND of the two streams, $p \vee q$. By observing enough output bits and measuring the frequency of ones, it is possible to estimate pq to arbitrary accuracy.

Applying this technique, the Hebbian update rule can be written $\Delta w_{ji} = \Delta w_{min} \Sigma_{n=1}^{M} I_i^n \vee \delta_j^n$, where $I_i^n$ and $\delta_j^n$ are binary pulses, members of a random bit stream of 0 and 1's of length M with probability of a 1 being $I_i$ and $\delta_j$ respectively.

It can be seen that the order of magnitude of the update is the time to emit M pulses, independent of array size. For an array of say 4000×4000, the speedup can be of order $10^4$.

The synaptic array with attendant neurons, capable of updating the synaptic matrix in O(1) time, is termed the Resistive Processing Unit (RPU). The RPU's can be placed in series, which enables a computational effect (Deep Neural Net or DNN). In this case, the input and output neurons are visible, the intermediate neurons are hidden. The algorithm is modified but the principle remains the same, information is propagated from the input to the output, where it is compared with the desired output, and then the error is back-propagated back to the input, in the process updating the synaptic weights.

A synaptic device is needed which stores a conductance which can be measured between input (horizontal) and output (vertical) lines. The conductance needs to be updatable by reception of coincident pulses on the input and output lines. There are specifications for the synaptic device.

A 4000×4000 array example includes the following specifications: number of states p to be writeable ~1000, time of pulse is 1 ns, conductance is w, w−1≈24 MOhm. MAX/MIN ratio≈10, number of states to be distiquished in read, and if states p+q=r, the if p is converted to r by q positive pulses, it is possible to revert to state p by applying q erase pulses (i.e. symmetry criterion). In some situations, more than one horizontal/vertical line per synapse is needed. There are native devices, e.g. memristors, which try to fulfill all functions with no additional circuitry and with a single input and single output line.

Turning now to an overview of aspects of the present invention, one or more embodiments provide a memristive device including a semiconducting layer that can be controllably "doped" by introducing or removing alkali impurities (e.g. Li, Na, or K). The semiconducting layer is an oxide, such as titanium oxide, having a wide band gap and is semi-insulating. Introducing an alkali, such as lithium, to this oxide layer changes the resistivity of the oxide layer causing it to be more conductive, while removing the alkali causes the oxide layer to be less conductive. The introduction of the alkali is performed by applying positive voltage pulses to a metal-alkali alloy or intermetallic acting as an electrode in the memristive device. This metal-alkali alloy electrode is arranged on the semiconducting layer in the memristive device. The voltage pulses cause the alkali (e.g. Li) to penetrate into the oxide layer. The increase in conductivity is due to the donation of an electron by the lithium ion to the conduction band of the oxide. Conversely, applying negative voltage pulses removes the alkali ions from the oxide layer causing the oxide layer to be less conductive. The memristive device can be utilized in an artificial neural network.

Turning now to a more detailed description of the present invention, one or more embodiments for forming a memristive device based on alkali-doping of transmission metal oxides (e.g. $TiO_2$) and the resulting structures therefrom are described in detail below by referring to the accompanying drawings in FIGS. 8-14.

Figure 8:
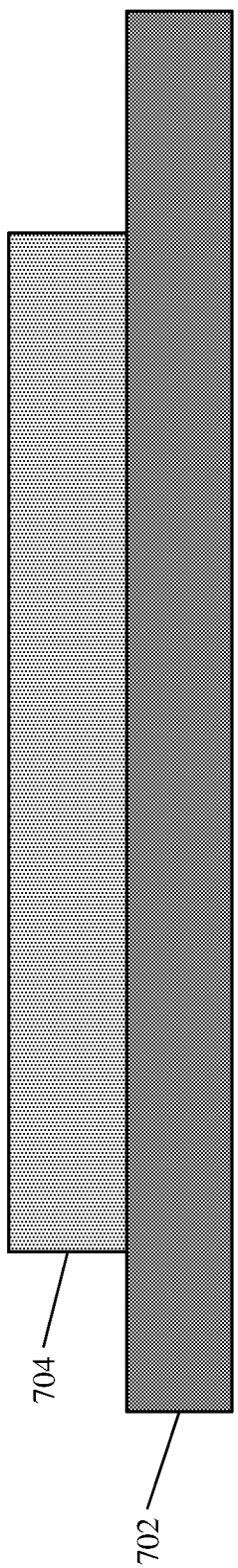
FIG. 8 depicts a side view of a memristive device after depositing an oxide layer on an active region of a conductive material layer according to one or more embodiment.

FIG. 8 illustrates a side view of a memristive device after depositing an oxide layer 704 on a conductive material layer 702 during an intermediate operation of forming the memristive device according to one or more embodiments of the present invention. The conductive material layer 702 can be in the form of either a free-standing layer of conducting material (e.g. a metal foil), or a thin film of a conductive material coated onto a substrate (e.g. Si wafer, glass, etc.), with the oxide layer 704 being deposited over an active region of the conductive material. In the illustrated example, the conductive material layer 702 includes a fluorine doped Tin Oxide (FTO) coated glass ($SnO_2$:F).

In some embodiments, the oxide layer 704 can be deposited using chemical vapor deposition (CVD), plasma-enhanced chemical vapor deposition (PECVD), atomic layer deposition (ALD), physical vapor deposition (PVD), chemical solution deposition, or other like processes.

Figure 9:
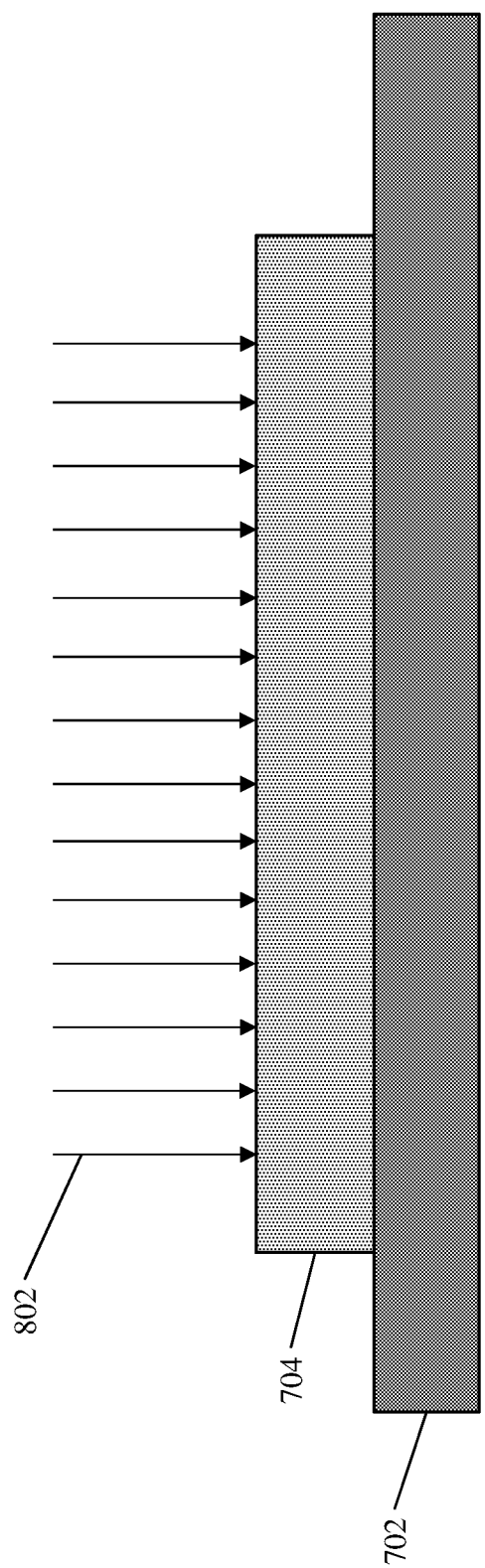
FIG. 9 depicts a side view of the memristive device as the oxide layer is intercalated with an alkali metal according to one or more embodiments.

FIG. 9 illustrates a side view of the memristive device being intercalated with an alkali metal 802 according to one or more embodiments of the present invention. In some embodiments, lithium can be intercalated in the oxide layer by using n-butyl lithium. The oxide layer 704 is exposed to n-butyl lithium 802 before being rinsed with the hydrocarbon solvent, e.g. hexane (not shown) to remove excess. The exposure time of the n-butyl lithium 802 to the oxide layer 704 can vary based on the application of the device such that a specific sheet resistance of the oxide layer 704 is needed for the application. In the example of $TiO_2$ as the transition metal oxide matrix, as the exposure time increases, the sheet resistance of the oxide layer 704 decreases. This variable time period of exposure of the n-butyl lithium 802 is used to tune an initial sheet resistance of the oxide layer 704 for various applications of the memristive device. In one or more embodiments, other transitional metal oxide materials can be utilized for the oxide layer 704.

Figure 10:
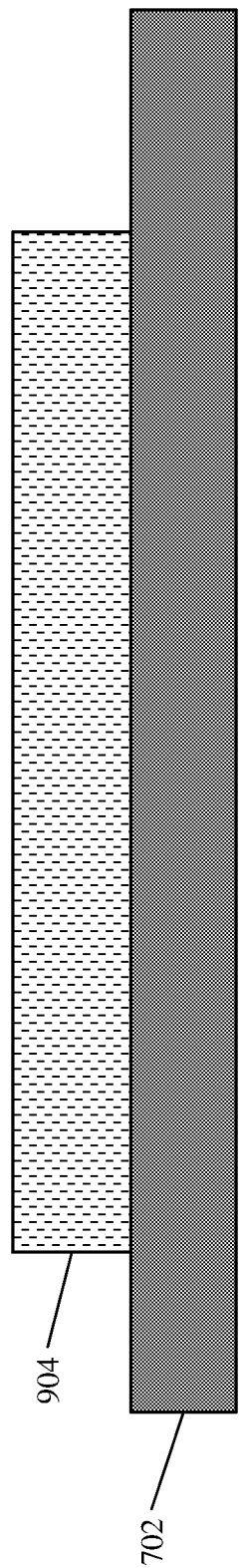
FIG. 10 depicts a side view of the memristive device after the oxide layer is intercalated with an alkali metal according to one or more embodiments.

FIG. 10 illustrates a side view of the memristive device after the oxide layer is intercalated with an alkali metal, such as n-butyl lithium, according to one or more embodiments of the present invention. The intercalated oxide layer 904 has a sheet resistance that is lower than the sheet resistance of the oxide layer 704 before intercalation with an alkali metal. The time of exposure of the n-butyl lithium is set to tune the desired sheet resistance of the intercalated oxide layer 904.

In another embodiment, the oxide layer 704 can be introduced to Li (or Na) by depositing a top contact (not shown) which contains both the electrode material and Li (or Na) in the same layer. In this example, un-doped $TiO_2$ layer is deposited and then the top contact is sputtered, the sputter including a metal material and a percentage of Li or Na. The effect would be to drive in/out of $TiO_2$ with the introduction of voltage pulses.

Figure 11:
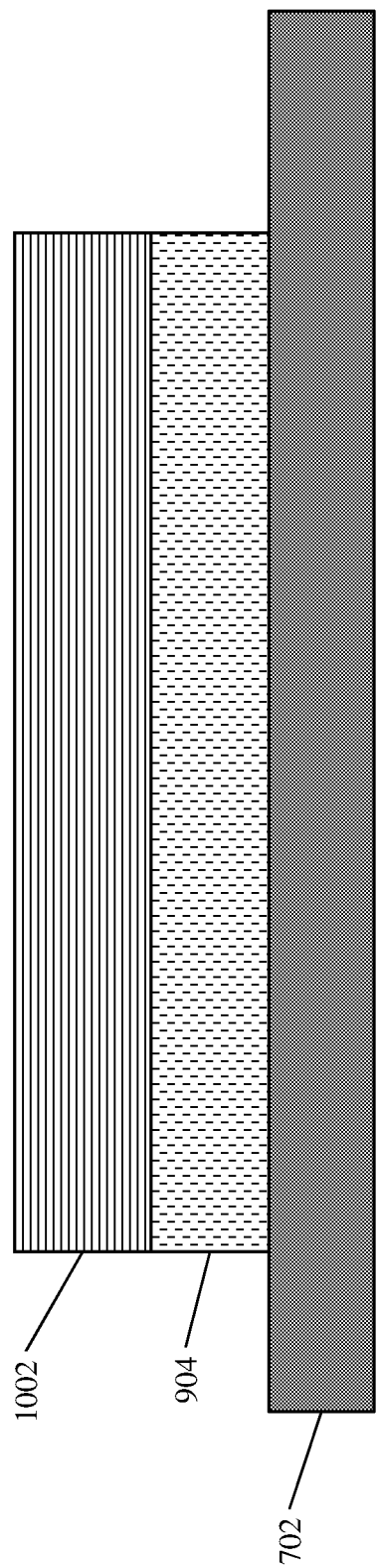
FIG. 11 depicts a side view of the memristive device after the deposition of an alloy layer on the oxide layer according to one or more embodiments.

FIG. 11 illustrates a side view of the memristive device after the deposition of an alloy layer according to one or more embodiments of the present invention. The alloy layer 1002 can be any metal-alkali alloy or intermetallic. In the illustrated example, the metal in the alloy is Tin (Sn) and the alkali is Lithium (Li). The alloy layer 1002 contains a reservoir of the alkali metal. The maximum amount of alkali material that is stored in the alloy layer 1002 depends on the thickness of the alloy layer and the thermodynamic solubility of the alkali in the metal.

For ease of illustration and discussion, only the one memristive device including a conductive material layer 702, intercalated oxide layer 904, and an alloy layer 1002 is shown. It is understood that any number of these devices can be formed on separate portions of the conductive material layer 702. In some embodiments, the memristive device is arranged in an array of other memristive devices having similar composition to the memristive device. In some embodiments, the memristive device is utilized in an artificial neural network for machine learning applications.

Figure 12:
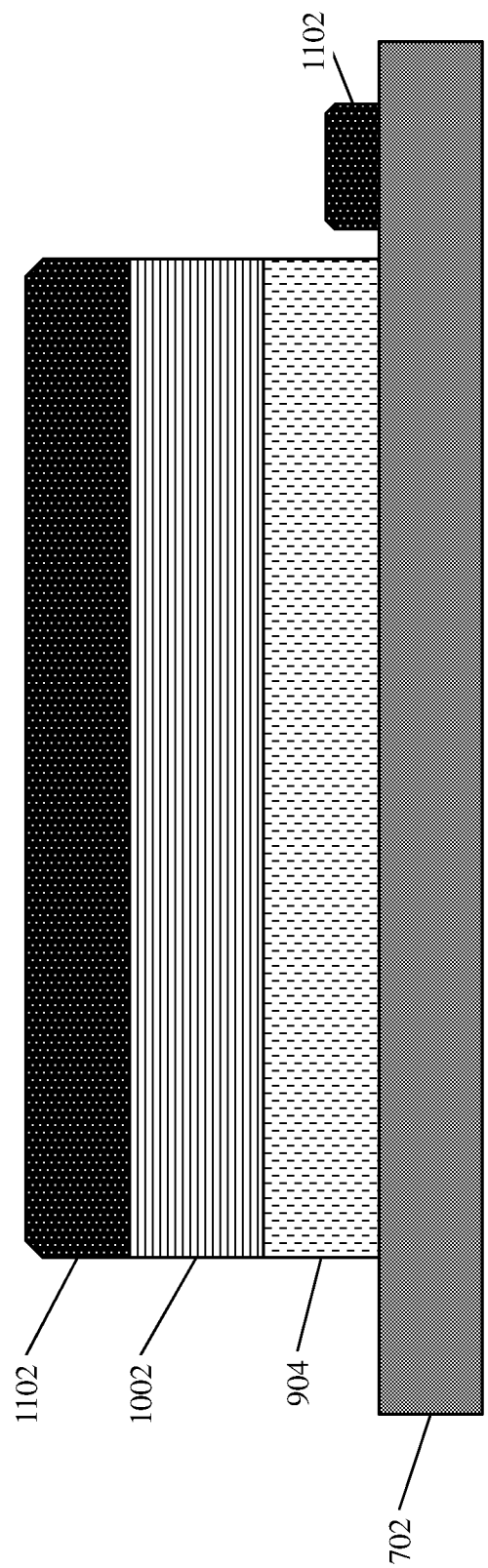
FIG. 12 depicts a side view of the memristive device after the deposition of metallic contact on the alloy layer and the conductive material layer.

FIG. 12 illustrates a side view of the memristive device after the deposition of metallic contacts 1102 on the alloy layer 1002 and the conductive material layer 702. The metallic contacts 1102 can be connected to a voltage source. In some embodiments, the metallic contacts 1102 can be deposited, for example, by first depositing an inter-level dielectric layer and forming a cavity in the inter-level dielectric by a photolithographic patterning and etching process such as reactive ion etching or any like process. Then the metallic contacts 1102 can be deposited on the alloy layer 1002 and conductive material layer 702 in the cavities etched in the inter-level dielectric. While, in the illustrative example, the metallic contacts 1102 are shown to be a size relative to the other layers of the memristive device; one of skill in the art can appreciate that any size metallic contacts 1102 can be utilized and arranged on the layers of the memristive device.

The metallic contacts can include any suitable conductive material including, for example, polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials.

Figure 13:
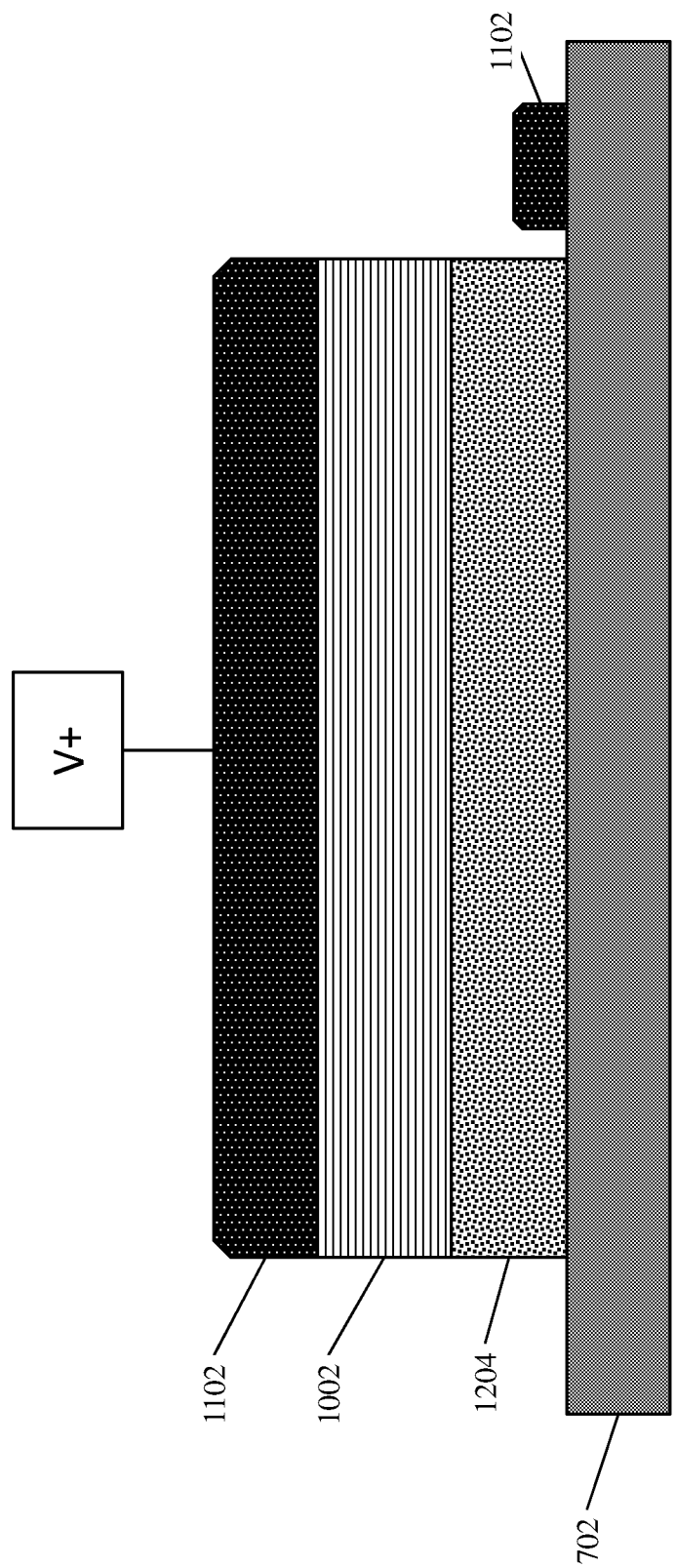
FIG. 13 depicts a side view of the memristive device after the application of one or more positive voltage pulses to the metallic contacts.

FIG. 13 illustrates a side view of the memristive device after the application of one or more positive voltage pulses to the metallic contacts 1102. The one or more positive voltage pulses cause the alkali metal in the alloy layer 1002 to intercalate into the oxide layer forming an oxide layer with ionized alkali material 1204. As the ionized alkali metal intercalates into the oxide layer 1204, the resistance decreases across the memristive device. The lower limit to the resistance of the device is determined by the quantity of Li in the $TiO_2$ layer after applying voltage pulses, whereas the upper limit to the resistance of the device is determined by the resistance across the film when all of the Li is removed by applying negative voltage pulses. The magnitude, length, and duration of the voltage pulses are selected to optimize the resistance change per pulse and the number of independent resistance states which can be stored in the device.

Figure 14:
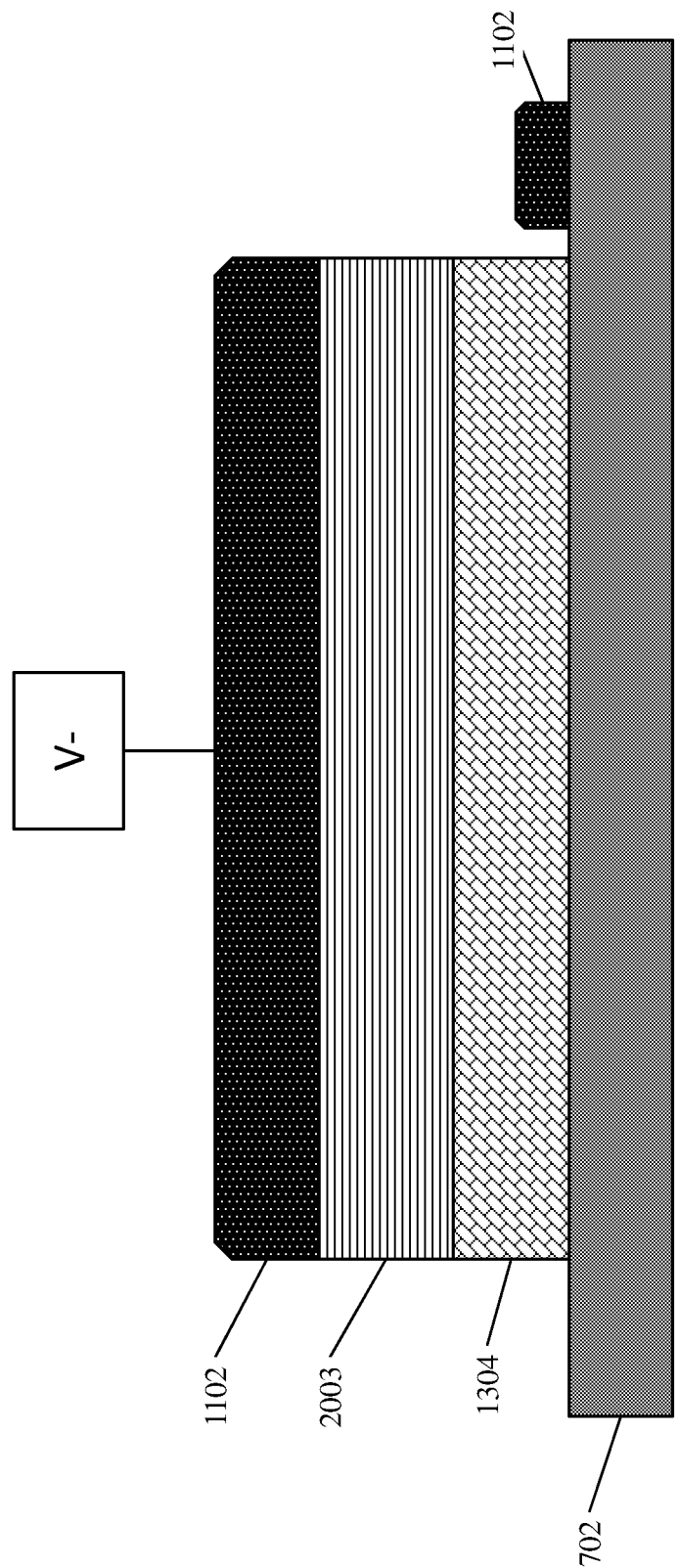
FIG. 14 depicts a side view of the memristive device after the application of one or more negative voltage pulses to the metallic contacts.

FIG. 14 illustrates a side view of the memristive device after the application of one or more negative positive voltage pulses to the metallic contacts 1002. The one or more negative voltage pulses cause the alkali ions to be removed from the oxide layer with the alkali material 1304 being transferred to the interface (between 1304 and 2003) or the alloy layer (2003), if present.

Figure 15:
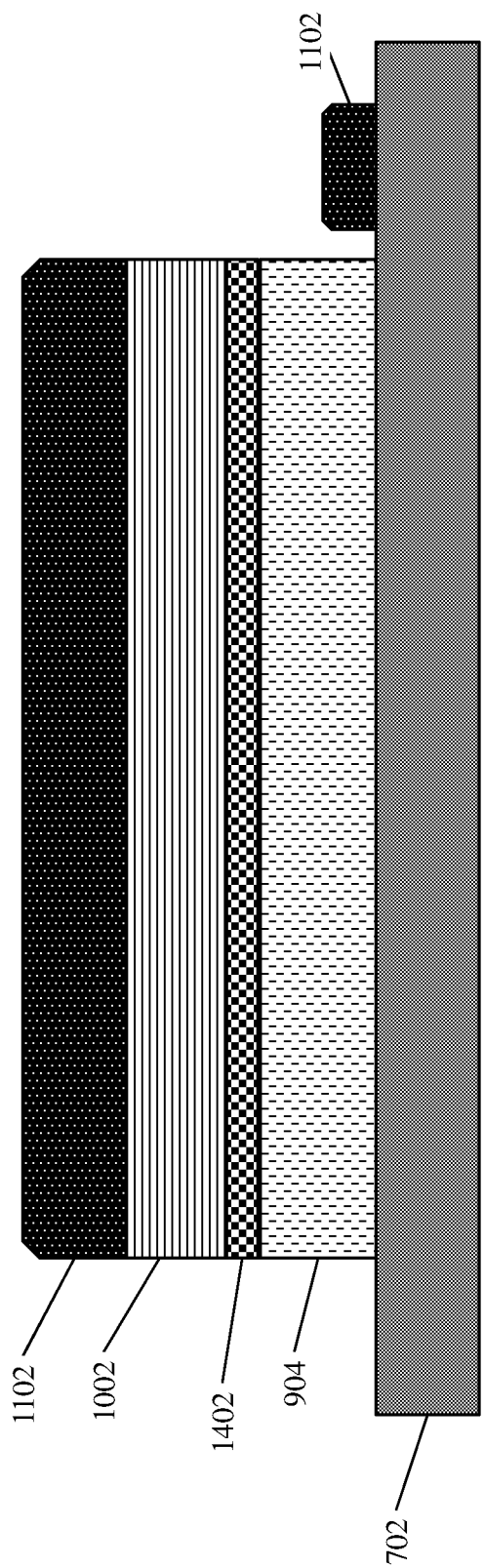
FIG. 15 depicts a side view of an alternative exemplary embodiment of a memristive device.

FIG. 15 illustrates a side view of an alternative exemplary embodiment of a memristive device with a diffusion barrier 1402 deposited between the alloy layer 1002 and the intercalated oxide layer 904. The diffusion barrier 1402 limits the leakage of the alkali material ions into the oxide layer 904 from the alloy material 1002 during idling (i.e. when no voltage pulses are being applied). The diffusion barrier 1402 can include $Al_2O_3$, silicon nitride, or any other material which allows the ions to pass across and be stored in between layer 1402 and 1002. The material selection for this diffusion barrier is subject to the requirement that it not prevent Li from reaching the interface with layer 1002 (i.e. it should not cause deposition of the Li at the interface between 904 and 1402). The presence of such a diffusion barrier would enable storage of the resistance state for a longer period of time (non-volatility).

Figure 16:
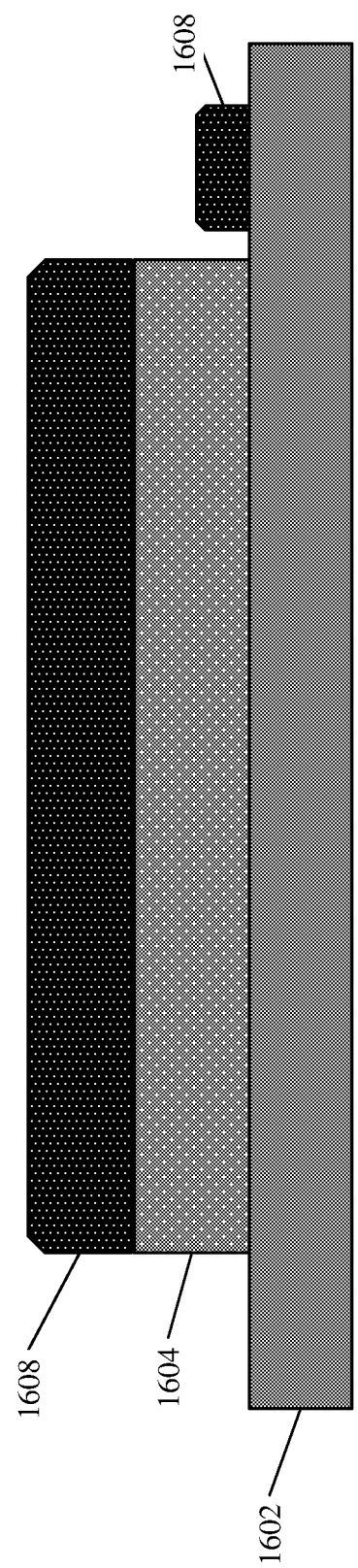
FIG. 16 depicts a side view of an alternative exemplary embodiment of a memristive device.

FIG. 16 illustrates an alternative embodiment of a memristive device. The memristive device includes an oxide layer 1604 arranged on a conductive material layer 1602. As discussed above, the conductive material layer 1602 can be in the form of either a free-standing layer of conducting material (e.g. a metal foil), or a thin film of a conductive material coated into a substrate (e.g. Si waver, glass, etc.), with the oxide layer 1604 being deposited over an active region on the conductive material layer 1602. In the illustrated example, the conductive material layer 1602 includes a fluorine doped Tin Oxide (FTO) coated glass ($SnO_2$:F).

The oxide layer 1604 is exposed to n-butyl lithium (not shown) before being rinsed with the hydrocarbon solvent, e.g. hexane (not shown) to remove excess. The exposure time of the n-butyl lithium to the oxide layer 1604 can vary based on the application of the device such that a specific sheet resistance of the oxide layer 1604 is needed for the application.

Metallic contacts 1608 are deposited on the oxide layer and on the conductive material layer 1608. The metallic contacts 1608 arranged on the oxide layer 1604 can be any suitable metallic contact material such as, for example, Tin (Sn). The metallic contacts are configured to receive one or more negative positive voltage pulses to the metallic contacts 1608. The one or more negative voltage pulses cause the alkali ions to be removed from the oxide layer with the alkali material 1604 being transferred to the interface (between 1604 and 1608) or the metallic contacts 1608.

Figure 17:
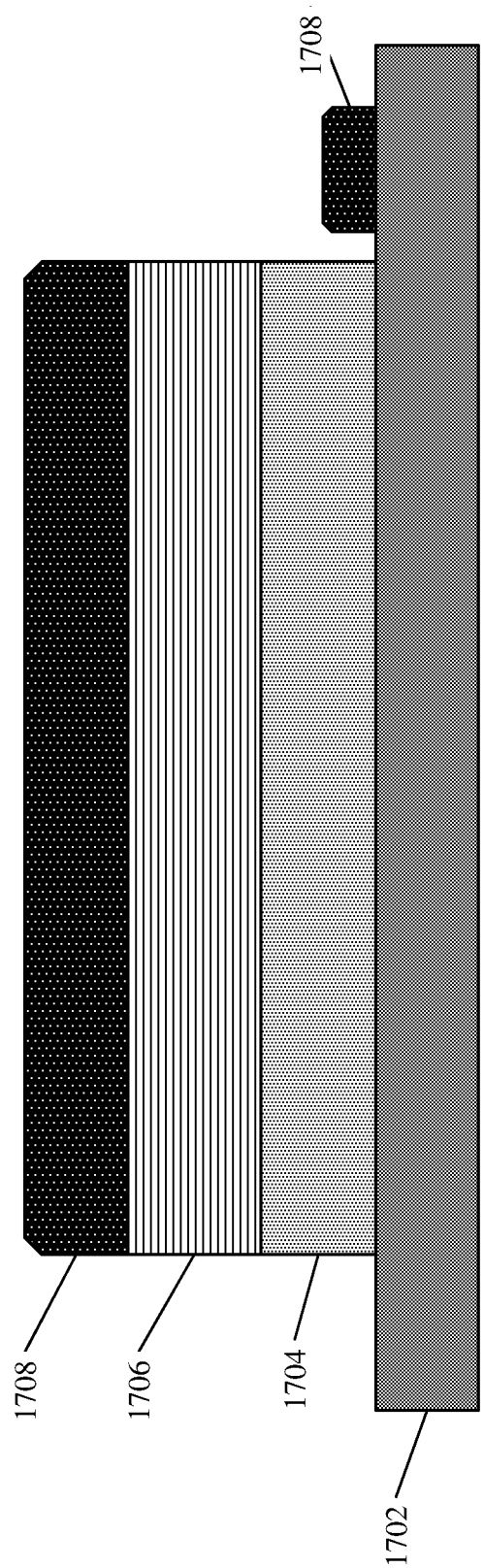
FIG. 17 depicts a side view of an alternative exemplary embodiment of a memristive device.

FIG. 17 illustrates a side view of alternative embodiment of a memristive device. The memristive device includes an oxide layer 1704 arranged on a conductive material layer 1702. As discussed above, the conductive material layer 1702 can be in the form of either a free-standing layer of conducting material (e.g. a metal foil), or a thin film of a conductive material coated into a substrate (e.g. Si waver, glass, etc.), with the oxide layer 1704 being deposited over an active region on the conductive material layer 1702. In the illustrated example, the conductive material layer 1702 includes a fluorine doped Tin Oxide (FTO) coated glass ($SnO_2$:F).

The memristive device includes an alloy layer 1706 deposited on the oxide layer 1704. The alloy layer 1706 can be any metal-alkali alloy or intermetallic. In the illustrated example, the metal in the alloy is Tin (Sn) and the alkali is Lithium (Li). The alloy layer 1706 contains a reservoir of the alkali metal. The amount of alkali material that is stored in the alloy layer 1706 depends on the thickness of the alloy layer and the thermodynamic solubility of the alkali in the metal.

The memristive device includes metallic contacts 1708 that can be deposited on the alloy layer 1706 and the conductive material layer 1702. The metallic contacts 1708 can be connected to a voltage source. In some embodiments, the metallic contacts 1708 can be deposited, for example, by first depositing an inter-level dielectric layer and forming a cavity in the inter-level dielectric by a photolithographic patterning and etching process such as reactive ion etching or any like process. Then the metallic contacts 1708 can be deposited on the alloy layer 1706 and conductive material layer 1702 in the cavities etched in the inter-level dielectric. While, in the illustrative example, the metallic contacts 1708 are shown to be a size relative to the other layers of the memristive device; one of skill in the art can appreciate that any size metallic contacts 1708 can be utilized and arranged on the layers of the memristive device.

The metallic contacts 1708 are configured to receive one or more positive voltage pulses to the metallic contacts 1708. The one or more positive voltage pulses cause the alkali metal in the alloy layer 1708 to intercalate into the oxide layer forming an oxide layer with ionized alkali material (not shown). As the ionized alkali metal intercalates into the oxide layer 1704, the resistance decreases across the memristive device. The lower limit to the resistance of the device is determined by the quantity of Li in the $TiO_2$ layer after applying voltage pulses, whereas the upper limit to the resistance of the device is determined by the resistance across the film when all of the Li is removed by applying negative voltage pulses. The magnitude, length, and duration of the voltage pulses are selected to optimize the resistance change per pulse and the number of independent resistance states which can be stored in the device.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A memristive device comprising:
    a first conductive material layer;
    an oxide material layer arranged on the first conductive layer; and
    a second conductive material layer arranged directly on the oxide material layer, wherein the second conductive material layer comprises a metal-alkali alloy,
    wherein the second conductive material layer and the oxide material layer are configured to, in response to a positive voltage pulse applied to the second conductive material layer, cause the intercalation of alkali metal from the metal-alkali alloy in to the oxide material layer, and
    wherein the second conductive layer and the oxide material layer are configured to, in response to a negative voltage pulse applied to the second conductive material layer, cause the removal of the alkali metal from the oxide material layer.

2. The memristive device of claim 1, wherein the oxide material layer comprises a transitional metal oxide.

3. A method of forming a memristive device, the method comprising:
    depositing an oxide material layer on a portion of a first conductive material layer; and
    depositing a second conductive material layer directly on a portion of the oxide material layer, wherein the second conductive material layer comprises a metal-alkali alloy; and
    configuring the second conductive layer and the oxide material layer such that, in response to a positive voltage pulse applied to the second conductive layer, the alkali metal intercalates into the oxide material layer.

4. The method of claim 3, wherein the oxide material layer comprises a transitional metal oxide.

5. A memristive device comprising:
    a first conductive material layer;
    an oxide material layer arranged on the first conductive material layer;
    a diffusion barrier layer arranged directly on the oxide material layer; and
    a second conductive material layer arranged directly on the diffusion barrier layer, wherein the second conductive material layer comprises a metal-alkali alloy,
    wherein the second conductive material layer and the oxide material layer are configured to, in response to a positive voltage pulse applied to the second conductive material layer, cause the intercalation of an alkali metal in to the oxide material layer, and
    wherein the second conductive layer and the oxide material layer are configured to, in response to a negative voltage pulse applied to the second conductive material layer, cause the removal of the alkali metal from the oxide material layer.

6. The memristive device of claim 5, wherein the oxide material layer is intercalated with an alkali metal.

7. The memristive device of claim 5, wherein the oxide material layer comprises a transitional metal oxide.

8. The memristive device of claim 7, wherein the transitional metal oxide comprises titanium oxide.

9. A method of forming a memristive device, the method comprising:
    depositing an oxide material layer on a portion of a first conductive material layer;
    depositing a diffusion barrier layer directly on a portion of the oxide material layer;
    depositing a second conductive material layer directly on a portion of the diffusion barrier layer, wherein the second conductive material layer comprises a metal-alkali alloy; and
    configuring the second conductive layer and the oxide material layer such that, in response to a positive voltage pulse applied to the second conductive layer, the alkali metal intercalates into the oxide material layer.

10. The method of claim 9, wherein the oxide material layer comprises a transitional metal oxide.

11. The method of claim 9, wherein the first conductive material layer comprises a fluorine doped tin oxide.

12. A memristive device comprising:
a first conductive material layer;
an oxide material layer arranged directly on the first conductive material layer, wherein the oxide material layer is exposed to an alkali metal for a duration of time causing the oxide material to include a first density of alkali metal; and
a second conductive material layer arranged directly on the oxide material layer,
wherein the second conductive material layer and the oxide material layer are configured to, in response to a positive voltage pulse applied to the second conductive material layer, cause the intercalation of an alkali metal in to the oxide material layer resulting in a second density of alkali metal in the oxide material layer;
wherein the second conductive layer and the oxide material layer are configured to, in response to a negative voltage pulse applied to the second conductive material layer, cause the removal of the alkali metal from the oxide material layer resulting in a third density of alkali metal in the oxide material layer;
wherein the second density is greater than the first density; and
wherein the third density is less than the second density.

13. The method of claim 12, wherein the oxide material layer comprises a transitional metal oxide.

14. The method of claim 13, wherein the alkali metal comprises n-butyl lithium.

15. The method of claim 12, wherein the second conductive material layer comprises a metal-alkali alloy.

* * * * *